US011053115B2

(12) United States Patent
Ghidoni (10) Patent No.: US 11,053,115 B2
(45) Date of Patent: Jul. 6, 2021

(54) MULTI-DEVICE TRANSDUCER MODULUS, ELECTRONIC APPARATUS INCLUDING THE TRANSDUCER MODULUS AND METHOD FOR MANUFACTURING THE TRANSDUCER MODULUS

(71) Applicant: STMICROELECTRONICS S.R.L., Agrate Brianza (IT)

(72) Inventor: Marco Omar Ghidoni, Melzo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 903 days.

(21) Appl. No.: 15/638,178

(22) Filed: Jun. 29, 2017

(65) Prior Publication Data

US 2018/0148323 A1 May 31, 2018

(30) Foreign Application Priority Data

Nov. 30, 2016 (IT) .................. 102016000121210

(51) Int. Cl.
| | | |
|---|---|---|
| *G01L 13/02* | (2006.01) | |
| *B81B 7/00* | (2006.01) | |
| *G01L 9/00* | (2006.01) | |
| *G01J 1/42* | (2006.01) | |
| *G01J 5/04* | (2006.01) | |

(Continued)

(52) U.S. Cl.
CPC .......... *B81B 7/0061* (2013.01); *B81B 7/0067* (2013.01); *B81C 1/00182* (2013.01); *G01J 1/0271* (2013.01); *G01J 1/429* (2013.01); *G01J 5/04* (2013.01); *G01L 9/0054* (2013.01); *G01L 13/025* (2013.01); *G01L 19/06* (2013.01); *B81B 2201/0264* (2013.01); *B81B 2201/0292* (2013.01); *G01D 11/245* (2013.01)

(58) Field of Classification Search
CPC .......... B81B 7/0067; B81B 2201/0264; B81B 2201/0292; B81C 1/00182; G01J 1/0271; G01J 5/04; G01L 9/0054; G01L 13/025; G01L 19/06; G01D 11/245
See application file for complete search history.

(56) References Cited

U.S. PATENT DOCUMENTS 4,581,676 A * 4/1986 Baxter .................. F27D 99/007
 361/283.4
4,790,192 A * 12/1988 Knecht ................. G01L 9/0054
 338/4

(Continued)

FOREIGN PATENT DOCUMENTS

| CN | 203554647 U | 4/2014 |
|---|---|---|
| EP | 1577656 A1 | 9/2005 |
| WO | 2013028399 A2 | 2/2013 |

*Primary Examiner* — David J Bolduc
(74) *Attorney, Agent, or Firm* — Seed Intellectual Property Law Group LLP (57) ABSTRACT

A transducer modulus, comprising: a substrate; a cap on the substrate, defining a chamber; and a sensor modulus in the chamber, integrating a first MEMS transducer facing the chamber, and a second MEMS transducer facing the supporting substrate. The cap has a first opening that forms a path for access of the first environmental quantity exclusively towards a sensitive element of the first transducer, and the supporting substrate has a second opening that forms a path for access of the second environmental quantity exclusively towards a sensitive element of the second transducer.

20 Claims, 5 Drawing Sheets

(51) Int. Cl.
  *G01J 1/02* (2006.01)
  *G01L 19/06* (2006.01)
  *B81C 1/00* (2006.01)
  *G01D 11/24* (2006.01)

(56) References Cited

U.S. PATENT DOCUMENTS

| | | | | |
|---|---|---|---|---|
| 5,969,591 | A * | 10/1999 | Fung | G01L 9/0042 338/4 |
| 6,431,003 | B1 * | 8/2002 | Stark | G01L 9/0073 73/718 |
| 6,925,884 | B2 * | 8/2005 | Hegner | G01L 9/0073 73/716 |
| 8,181,531 | B2 * | 5/2012 | Carlen | G01L 9/0042 73/715 |
| 8,359,927 | B2 * | 1/2013 | Hooper | B81B 7/0061 73/715 |
| 8,701,496 | B1 * | 4/2014 | Brown | G01L 19/145 73/715 |
| 8,847,340 | B2 * | 9/2014 | Baldo | B81B 7/0061 257/419 |
| 8,879,767 | B2 | 11/2014 | Wickstrom | |
| 9,726,561 | B2 * | 8/2017 | Besling | G01L 9/0073 |
| 2005/0208696 | A1 | 9/2005 | Villa et al. | |
| 2008/0202209 | A1 * | 8/2008 | Lambkin | G01J 1/04 73/31.05 |
| 2010/0133631 | A1 * | 6/2010 | Benzel | G01L 15/00 257/417 |
| 2012/0175747 | A1 * | 7/2012 | Schlarmann | B81C 1/00309 257/622 |
| 2013/0156235 | A1 * | 6/2013 | Wickstrom | H04R 19/04 381/174 |
| 2013/0221457 | A1 * | 8/2013 | Conti | B81B 7/0061 257/416 |
| 2013/0322675 | A1 * | 12/2013 | Zoellin | H04R 1/04 381/355 |
| 2014/0197501 | A1 * | 7/2014 | Dehe | B81B 3/0072 257/416 |
| 2015/0023523 | A1 * | 1/2015 | Elian | H04R 1/083 381/91 |
| 2015/0260593 | A1 * | 9/2015 | Hsu | G01L 9/0072 73/754 |
| 2015/0268115 | A1 * | 9/2015 | Robert | B81B 3/0021 73/718 |
| 2016/0169758 | A1 * | 6/2016 | Hooper | B81B 7/0061 73/717 |
| 2017/0313579 | A1 * | 11/2017 | Ghidoni | B81B 7/02 |
| 2017/0318396 | A1 * | 11/2017 | Brioschi | B06B 1/0292 |
| 2018/0149538 | A1 * | 5/2018 | Gritti | G01L 9/08 |

* cited by examiner

MULTI-DEVICE TRANSDUCER MODULUS, ELECTRONIC APPARATUS INCLUDING THE TRANSDUCER MODULUS AND METHOD FOR MANUFACTURING THE TRANSDUCER MODULUS

BACKGROUND

Technical Field

The present disclosure relates to a transducer modulus, to an electronic apparatus including the transducer modulus, and to a method for manufacturing the transducer modulus.

Description of the Related Art

As is known, a pressure transducer, or sensor, of a MEMS (Micro-Electro-Mechanical System) type comprises a membrane sensitive structure, which is able to transduce a value of environmental pressure into an electrical quantity and includes a thin membrane suspended over a cavity provided in a silicon body. Diffused within the membrane are piezoresistive elements connected together to form a Wheatstone bridge. When subjected to a pressure, the membrane undergoes deformation, causing a variation of resistance of the piezoresistive elements, and thus unbalancing of the Wheatstone bridge. A reading electronics is designed to carry out appropriate operations of processing (amongst which operations of amplification and filtering) of said electrical quantity so as to supply an electrical output signal (for example, a voltage) representing the environmental pressure detected.

Figure 1:
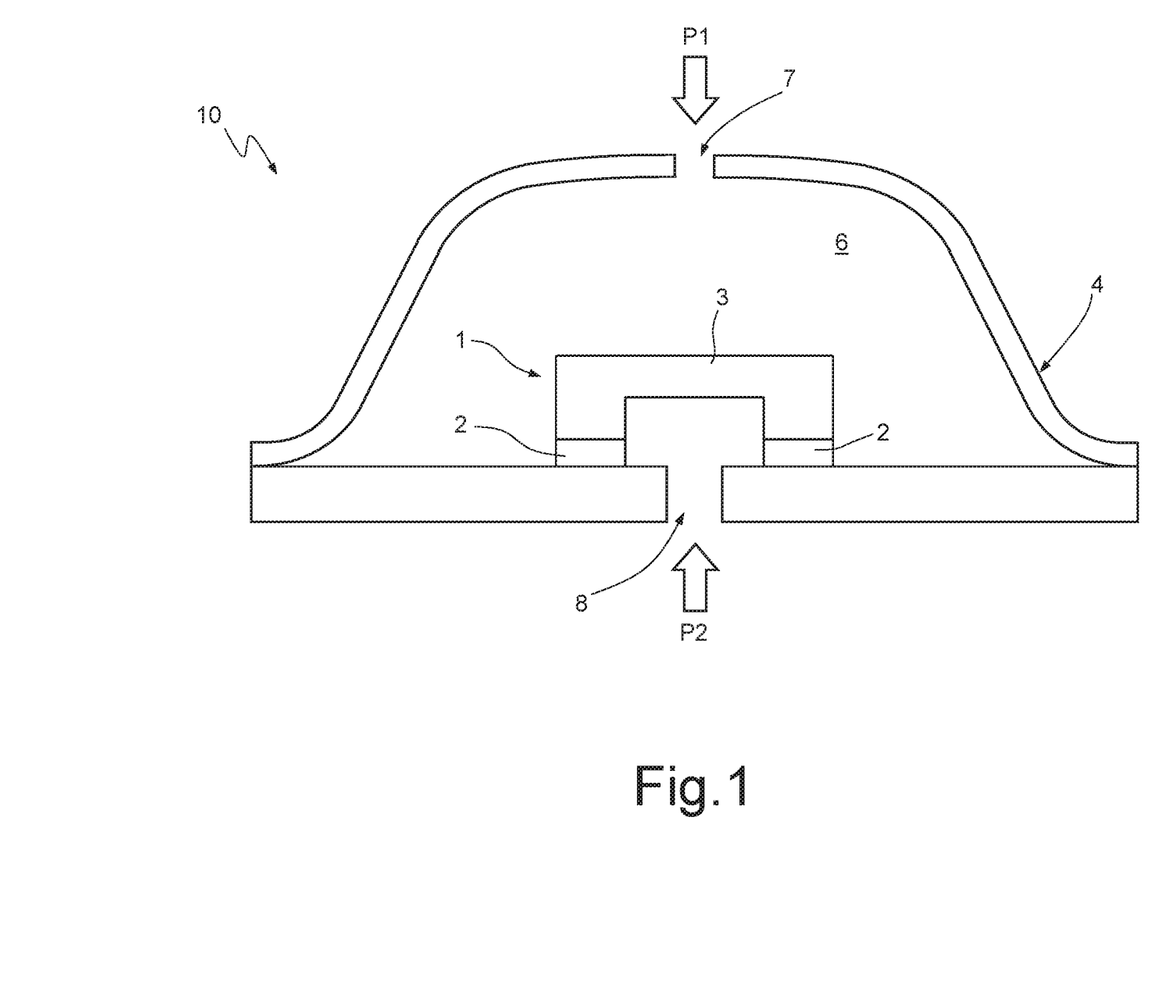
FIG. 1 shows, in lateral-sectional view, a MEMS transducer modulus of a known type, which may be used for carrying out differential measurements of environmental quantities.

Pressure sensors of a differential type are known, designed to provide a signal identifying the difference between two environmental pressures to which the sensor itself is subjected. A sensor of this type is schematically illustrated in FIG. 1. With reference to FIG. 1, a differential pressure sensor 10 comprises a silicon die 1, which has an annular portion 2 and a membrane 3 (e.g., circular or quadrangular) coupled to a top side of the annular portion 2. A bottom side of the annular portion 2 is coupled to a protective package 4, for example by an adhesive layer. The protective package 4 includes a housing having an inner chamber 6 in which the silicon die 1 is mounted. The protective package 4 has a first through opening 7, provided on a front side of the protective package 4, which arranges an environment external to the protective package 4 in communication with the inner chamber 6. The protective package 4 further has a second through opening 8, provided on a rear side of the protective package 4. The silicon die 1 is mounted so that the annular portion 2 completely surrounds the second through opening 8, preventing fluidic connection with the inner chamber 6.

The differential pressure sensor 10 is thus suited to being mounted in systems/components in which the first through opening 7 is in direct communication with a first environment at environmental pressure P1, and the second through opening 8 is in direct communication with a second environment at environmental pressure P2. The first through opening 7 thus forms an access for the pressure P1 that acts on a first side of the membrane 3, causing deformation thereof. The second through opening 8 forms a respective access for the pressure P2 that acts on a second side, opposite to the first side, of the membrane 3 generating a force tending to deform the membrane 3 that counters the force generated by the pressure P1. The resulting deformation of the membrane 3 is indicative of the difference between the pressure P1 and the pressure P2, and the signal transduced by the differential pressure sensor 10 is a differential pressure signal.

The document U.S. Pat. No. 8,847,340 describes a further differential pressure sensor 10 of a known type, which may be used for the differential measurement of pressures of environments isolated from one another.

A disadvantage associated with sensors of the type described previously lies in the fact that, in the case where it is desired to monitor also the absolute pressures P1, P2 of the respective environments, two further pressure sensors would be provided, one exclusively subjected to the pressure P1 and the other exclusively subjected to the pressure P2, or else, alternatively, to provide a differential sensor as in FIG. 1, an absolute sensor that measures the pressure P1 (or P2), and a further processing chip that detects the difference between the pressures P1 and P2 and the absolute pressure P1 (or P2) and that calculates the pressure P2 (or P1). In either case, there would be a consumption of area and an increase in costs.

On the other hand, in specific operating conditions (e.g., in a control system for a hydraulic circuit), there is felt the need to detect, in addition to the differential pressure, also the individual pressures of the environments in which the differential sensor is immersed, for example to monitor specific conditions of safety of said environments (e.g., to prevent the pressures P1 and P2 from departing from respective predefined safety ranges).

The aforementioned disadvantages may be noted in sensors and transducers of a type different from pressure sensors and transducers, for example in sensors for detecting light radiation (IR/UV).

BRIEF SUMMARY

According to one or more embodiments of the present disclosure, a transducer modulus, an electronic apparatus including the transducer modulus, and a method for manufacturing the transducer modulus, are provided. In at least one embodiment, the transducer modulus houses a plurality of devices designed to carry out differential and absolute measurements of environmental quantities to be detected.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 2:
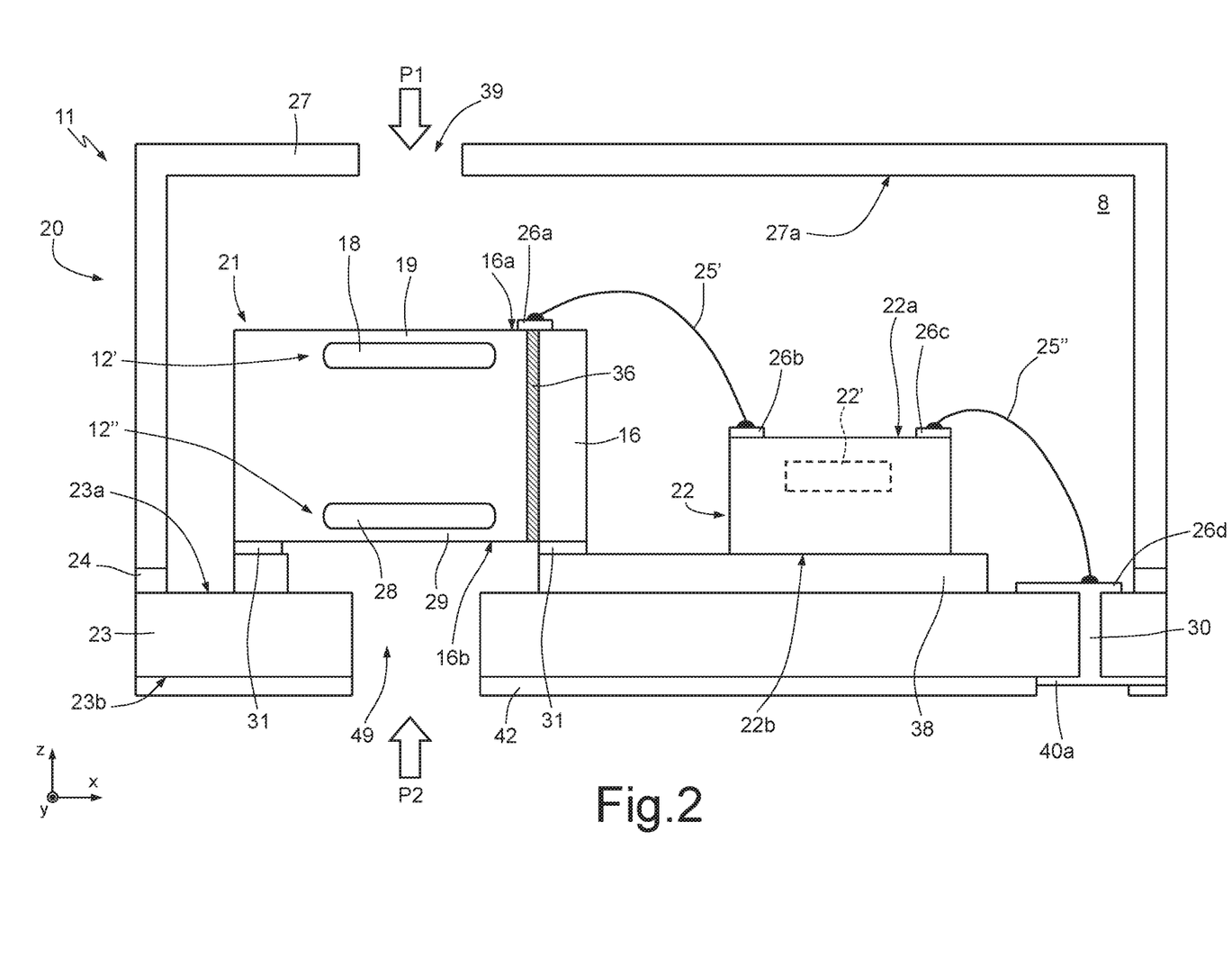
FIG. 2 shows, in lateral-sectional view, a transducer modulus according to an embodiment of the present disclosure, which may be used for carrying out differential measurements and absolute measurements of environmental quantities.

With reference to FIG. 2, a transducer modulus 11 according to one aspect of the present disclosure is represented, in a system of spatial co-ordinates X, Y, and Z and in lateral-sectional view. The present description will make explicit reference to transduction of an environmental pressure into an electrical signal. However, the teaching according to the present disclosure applies in a similar way to transducers of a different type, as is evident to a person skilled in the art.

The transducer modulus 11 comprises a substrate 23 having a top side 23a on which a cap 27 is arranged, which defines a cavity, or chamber, 8. In one embodiment, the substrate 23 is a substrate of an LGA (Land Grid Array) type. In an alternative embodiment, the substrate 23 is made of semiconductor material (e.g., silicon), obtained using known micromachining processes. The cap 27 may be made of metal or pre-molded plastic material and has a through opening 39 designed to arrange the chamber 8 in fluidic communication with an environment external thereto. In the context of the present disclosure, by "fluidic connection" is meant a connection that enables passage from and to the chamber 8 of a liquid and/or a gas, including air, according to the specifications of the production and use. Further embodiments, described explicitly in what follows, envisage passage of electromagnetic radiation at different wavelengths (one or more of the IR, UV, and visible bands).

The cap 27 is coupled to the substrate 23 by coupling regions 24 (soldering regions, or regions of glue, or any suitable bonding material or structure). The substrate 23 and the cap 27 form together a package 20.

A first chip, or sensor chip, 21 is housed in the chamber 8 and integrates MEMS structures for transduction of signals of environmental pressure into electrical signals. In particular, the first chip 21 integrates a first MEMS transducer 12' and a second MEMS transducer 12". In particular, the transduction is carried out with the aid of piezoresistors. In one embodiment, the sensor chip 21 comprises a monolithic body 16 of semiconductor material, preferably silicon, in particular monocrystalline silicon for example of an N type with orientation (100) of the crystallographic plane. The monolithic body 16 has, for example, a quadrangular section delimited at the top by a first surface 16a and at the bottom by a second surface 16b, opposite and parallel to the first surface 16a. In one embodiment, the first surface 16a forms a front side of the sensor chip 21, and the second surface 16b forms a rear side of the sensor chip 21.

The monolithic body 16 includes a first buried cavity 18, having, for example, a square section. The first cavity 18 is separated from the first surface 16a by a thin portion of the monolithic body 16, which forms a membrane 19. According to a non-limiting embodiment, the thickness of the membrane 19 is smaller than the thickness of the first cavity 18 in order to prevent shear stresses at the points of constraint of the membrane 19, which could cause failure of the membrane itself.

At least partially integrated within the membrane 19, piezoresistive sensing elements are present (in particular, four in number, arranged at the vertices of an ideal cross centered at the center of the membrane—not illustrated in FIG. 2), for instance formed by doped regions, for example, with doping of a P type. The piezoresistive sensing elements may be obtained via diffusion of dopant atoms through an appropriate diffusion mask and have, for example, an approximately rectangular section. Further, the piezoresistive sensing elements may be connected together so as to form a Wheatstone-bridge circuit. Alternatively, the first piezoresistive sensing elements may form part of a ring oscillator circuit.

The monolithic body 16 further includes a second buried cavity 28, similar to the first cavity 18 and having, for example, a square section. The second cavity 28 is separated from the second surface 16b by a thin portion of the monolithic body 16, which forms a respective membrane 29. In order to form a fluidic connection between the membrane 29 and an environment external to the package 20, a through opening 49 extends through the substrate 23, arranging in fluidic connection the membrane 29 with the environment external to the package 20. According to a non-limiting embodiment, the thickness of the membrane 29 is smaller than the thickness of the second cavity 28 in order to prevent shear stresses at the points of constraint of the membrane 29, which could cause failure of the membrane itself.

At least partially integrated within the membrane 29 are respective piezoresistive sensing elements (in particular, four in number, arranged at the vertices of an ideal cross centered at the center of the membrane 29—not illustrated in FIG. 2), including doped regions, for example, with doping of a P type. The piezoresistive sensing elements may be obtained via diffusion of dopant atoms through an appropriate diffusion mask and have, for example, an approximately rectangular section. Further, the piezoresistive sensing elements may be connected together so as to form a Wheatstone-bridge circuit. Alternatively, the first piezoresistive sensing elements may form part of a respective ring oscillator circuit.

The first and second cavities 18, 28 may be obtained according to any desired manufacturing process, not described in detail herein in so far as it does not form the subject of the present disclosure. European patent EP1577656, which also published as U.S. Pat. Pub. No. 20050208696, describes a method for providing buried cavities designed for this purpose.

In use, the transducer modulus 11 is configured to be installed so that the through opening 39 is oriented towards a first environment at a pressure P1 and the through opening 49 is oriented towards a second environment at a pressure P2. Typically, in an operating condition, the first and second environments are not in communication with one another so that the value of pressure P1 of the first environment does not affect the value of pressure P2 of the second environment.

Thus, the membrane 19 is configured to deflect exclusively as a function of the value of pressure P1, and the membrane 29 is configured to deflect exclusively as a function of the value of pressure P2 (excluding possible deflexions of the membrane 19, 29 caused by residual stresses deriving from the manufacturing process).

The chamber 8 further houses a second processing chip 22 integrating a processing and control circuit, in particular an ASIC (Application Specific Integrated Circuit) 22'. The ASIC 22', per se known, comprises signal-processing circuits (for example, a charge-amplifier circuit for an electroacoustic capacitive sensor) and/or the components for enabling proper operation of the transducers 12', 12", in particular as regards the electrical/electronic operations of transduction of the signals generated by the piezoresistive elements integrated in, or in the proximity of, the membranes 19, 29. The ASIC 22' is electrically coupled to the first and second transducers 12', 12" by respective conductive wires 25' (just one of which is illustrated in the figure), formed with the wire-bonding technique. The wire bonds 25' connect together respective pads 26a and 26b of the first and second chips 21, 22.

Further electrical connections 25" (only one of which is illustrated in the figure), for example formed with the wire-bonding technique, are provided for coupling one or more pads 26c of the processing chip 22 to respective pads 26d of the substrate 23.

The first and second chips 21, 22 are arranged side by side on the substrate 23 of the package 20.

A plurality of pads 26a, which extend over the front side 16a of the monolithic body 16, are used for supplying both the signals transduced by the piezoresistors of the membrane 19 and the signals transduced by the piezoresistors of the membrane 29 to the ASIC 22'. Thus, each pad 26a is designed to form an electrical-contact region for supplying the respective signals transduced by the piezoresistors of the membrane 19 and by the piezoresistors of the membrane 29 to the ASIC 22'. Further, in order to convey the signals transduced by the piezoresistors of the membrane 29 towards the front side 16a of the monolithic body 16, at least one conductive through via 36 is present that traverses the monolithic body 16 in the direction Z, thus forming at least one conductive path between the piezoresistors of the membrane 29 and a respective electrical-contact pad 26a. Even though FIG. 2 illustrates a single conductive through via 36, the monolithic body 16 may include a plurality of similar conductive through vias.

The sensor chip 21 is coupled to the substrate 23 at the rear surface 16b of the monolithic body 16, for example by a solder mask 38, and to the latter by an adhesive layer, a layer of glue, 31, or any other suitable bonding material. Likewise, also the processing chip 22 is coupled to the substrate 23 via the solder mask 38. Other modalities of coupling of the first and second chips 21, 22 to the substrate 23 may be envisaged.

It may be noted that the layer of glue 31 (in particular, of a non-conductive type) extends for the entire perimeter of the monolithic body 16 to form an annular fluid-tight region so that, in use, it isolates completely the environment at pressure P2 from the chamber 8, which is, instead, at the pressure P1. It may further be noted that the solder mask 38 and the adhesive layer 31 surround the membrane 29 defining a chamber between the membrane 29 and the substrate 23 of dimensions (in particular along Z) such as to enable, in use, deflection of the membrane 29 (along Z).

The ASIC 22' is provided at a front surface 22a of the processing chip 22, opposite to the rear surface 22b. Appropriate metallization layers and/or conductive through vias have the function of routing the electrical signals from inside the chamber 8 and/or the substrate 23 to the outside of the package 20 (a conductive through via 30, which connects the metallizations on both sides of the substrate 23, is illustrated by way of example in FIG. 2).

Electrical-connection elements 40a, for example in the form of conductive lands, are provided on a bottom side 23b of the substrate 23 (the side exposed towards the outside of the chamber 8, opposite to the top side 23a), for soldering and electrical connection to a PCB (Printed-Circuit Board), and/or for testing operations. A further solder mask 42 may be applied at the bottom side 23b of the substrate 23.

In summary, according to the embodiment of FIG. 2, the through opening 39 and the through opening 49 extend on sides opposite to one another of the package 20 and, in this way, the transducer modulus 11 is configured to be installed so that the through opening 39 and the through opening 49 face respective environments, isolated from one another, having the respective pressures P1 and P2. Consequently, in use, the membrane 19 will be subject to a deformation that is a function exclusively of the pressure P1, whereas the membrane 29 will be subject to a deformation that is a function exclusively of the pressure P2. The respective signals transduced by the respective piezoresistors are sent to the processing chip 22 so as to be processed by the ASIC 22'. The processing chip 22, after processing of the signals (said processing not being described in detail herein in so far as it does not constitute the subject of the present disclosure) supplies at output both the absolute values of the pressures P1 and P2 measured and the differential value of the pressures P1 and P2.

Figure 3:
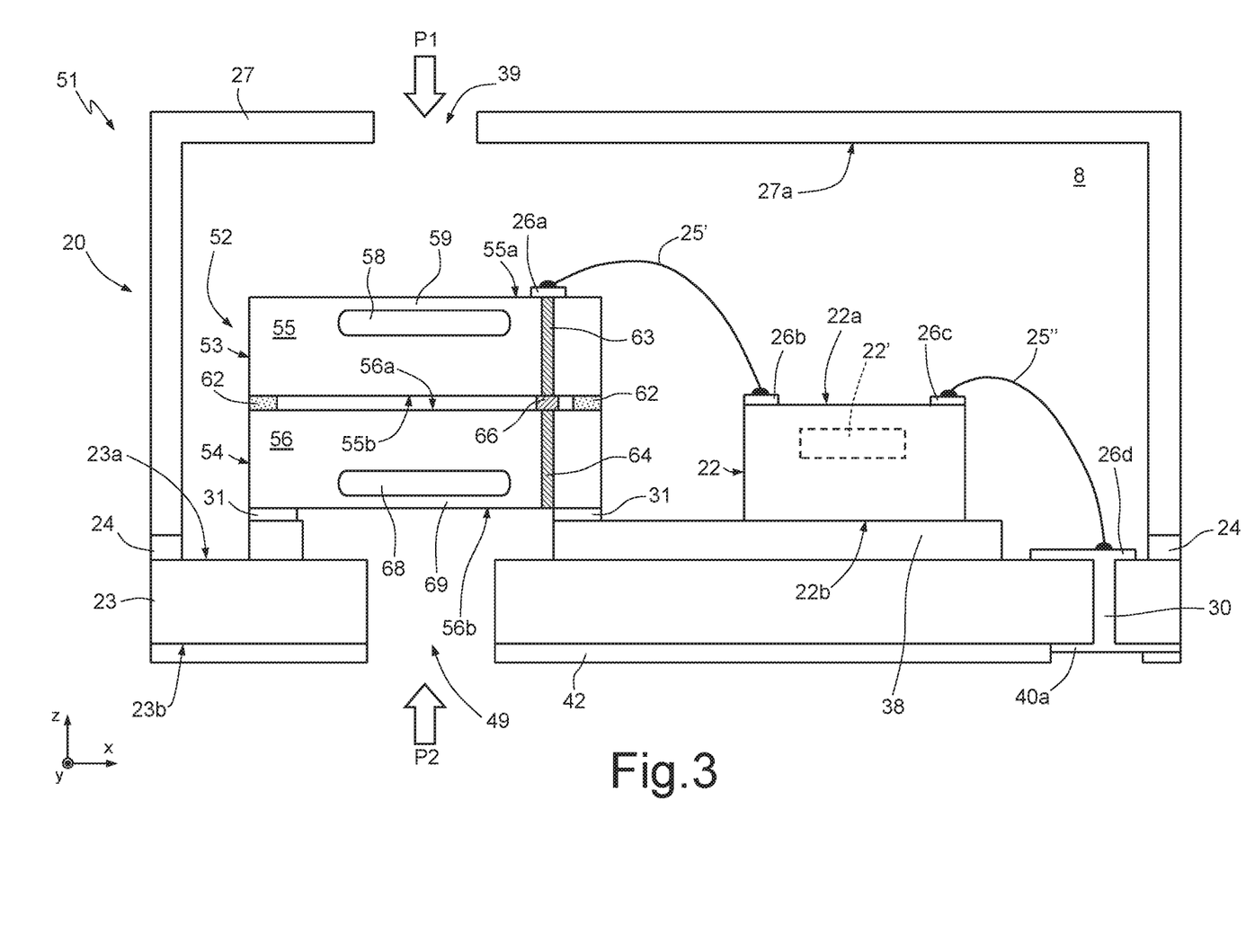
FIG. 3 shows, in lateral-sectional view, a transducer modulus according to an embodiment alternative to that of FIG. 2, which may be used for carrying out differential measurements and absolute measurements of environmental quantities.

FIG. 3 illustrates, in a system of spatial co-ordinates X, Y, and Z and in lateral-sectional view, a transducer modulus 51 according to a further aspect of the present disclosure. The transducer modulus 51 comprises (in a way similar to what has been described with reference to the transducer modulus 11 of FIG. 2—elements in common are here designated by the same reference numbers and are not described in further detail) a substrate 23 on which a cap 27 is arranged, which defines the chamber 8 and forms, together with the substrate 23, the package 20.

A sensor modulus 52 is housed in the chamber 8 and includes two stacked dies that integrate respective MEMS structures for transduction of signals of environmental pressure into electrical signals. In particular, a first die integrates a first MEMS transducer 53 and a second die integrates a second MEMS transducer 54. By way of example, transduction is carried out with the aid of piezoresistors. The first and second transducers 53, 54 each comprise a respective semiconductor body 55, 56, preferably of silicon, in particular monocrystalline silicon, for example, of an N type with orientation (100) of the crystallographic plane. The semiconductor body 55 has, for example, a quadrangular section delimited at the top by a first surface 55a and at the bottom by a second surface 55b, opposite and parallel to the first surface 55a. Likewise, the semiconductor body 56 has, for example, a quadrangular section delimited at the top by a first surface 56a and at the bottom by a second surface 56b, opposite and parallel to the first surface 56a.

The first transducer 53 comprises a first buried cavity 58, having for example a square section. The first cavity 58 is separated from the first surface 55a by a thin portion of the semiconductor body 55, which forms a membrane 59. The membrane 59 is flexible and is able to deflect as a function of a pressure P1 of the external environment with which the cavity 8 is in fluidic connection. According to a non-limiting embodiment, the thickness of the membrane 59 is smaller than the thickness of the first cavity 58 in order to prevent shear stresses at the points of constraint of the membrane 59, which could cause failure of the membrane itself.

Present at least partially inside the membrane 59 are piezoresistive sensing elements (in particular, four in number, arranged at the vertices of an ideal cross centered at the center of the membrane 59—not illustrated in FIG. 3), including doped regions, for example, with doping of a P type. The piezoresistive sensing elements may be obtained via diffusion of dopant atoms through an appropriate diffusion mask and have, for example, an approximately rectangular section; further, the piezoresistive sensing elements may be connected together so as to form a Wheatstone-bridge circuit. Alternatively, the first piezoresistive sensing elements may form part of a ring oscillator circuit.

The second transducer 54 includes, in a way similar to the first transducer 53, a second buried cavity 68, having, for example, a square section. The second cavity 68 is separated from the second surface 56a by a thin portion of the semiconductor body 56, which forms a membrane 69. In order to form a fluidic connection between the membrane 69 and an environment external to the package 20 at environmental pressure P2, the through opening 49 is present, which extends through the substrate 23, arranging in fluidic connection the membrane 69 with an environment external to the package 20 that in use, as described previously, is at a pressure P2. The membrane 69 is flexible and is able to deflect as a function of the value of the pressure P2. According to a non-limiting embodiment, the thickness of the membrane 69 is smaller than the thickness of the second cavity 68 in order to prevent shear stresses at the points of constraint of the membrane 69, which could cause failure of the membrane itself.

At least partially within the membrane 69, piezoresistive sensing elements are present (in particular, four in number, arranged at the vertices of an ideal cross centered at the center of the membrane 69—not illustrated in FIG. 3), including doped regions, for example, with doping of a P type. The piezoresistive sensing elements may be formed via diffusion of dopant atoms through an appropriate diffusion mask and have, for example, an approximately rectangular section. Further, the piezoresistive sensing elements may be connected together so as to form a Wheatstone-bridge circuit. Alternatively, the first piezoresistive sensing elements may form part of a respective ring oscillator circuit.

The first and second cavities 58, 68 may be obtained according to any desired manufacturing process, not described in detail herein in so far as it does not form the subject of the present disclosure. U.S. Pat. Pub. No. 20050208696 referred to above describes a process for manufacturing buried cavities designed for this purpose.

The first and second transducers 53, 54 are arranged stacked on one another so that the second surface 55b of the semiconductor body 55 faces the first surface 56a of the semiconductor body 56. A coupling region 62 extends between the second surface 55b of the semiconductor body 55 and the first surface 56a of the semiconductor body 56, coupling them together. In a non-limiting embodiment, the coupling region 62 is shaped like a frame and extends along outer edge regions of the second surface 55b of the semiconductor body 55 and of the first surface 56a of the semiconductor body 56.

The chamber 8 further houses the second chip (processing chip) 22 integrating a processing circuit, or ASIC 22', according to what has already been described with reference to FIG. 2 and not described any further herein.

In order to supply to the ASIC 22' both the signals transduced by the piezoresistors of the membrane 59 and the signals transduced by the piezoresistors of the membrane 69, according to one aspect of the present disclosure, electrical-contact pads 26a are provided (just one of which is illustrated in FIG. 3) on the first surface 55a of the semiconductor body 55 (or, more in general, on the front side of the first transducer 53). Each pad 26a is designed to form an electrical-contact region for supplying the respective signals transduced by the piezoresistors of the membrane 59 and by the piezoresistors of the membrane 69 to the ASIC 22'. In particular, in order to convey the signals transduced by the piezoresistors of the membrane 69 towards the front side of the first transducer 53, there are provided a first conductive through via 63 that traverses the semiconductor body 55 and a second conductive through via 64 that traverses the semiconductor body 56. The first and second conductive through vias 63, 64 are in mutual electrical connection by a solder-paste region 66, which extends inside the frame 62. A conductive path is thus formed between the piezoresistors of the membrane 69 and a respective electrical contact pad 26a. Further conductive vias may be present according to the need, electrically coupled together by respective solder-paste regions.

In a similar way to what has been described with reference to the transducer modulus 11 of FIG. 2, also the transducer modulus 51 is configured to be installed so that the through opening 39 and the through opening 49 face respective environments, isolated from one another, having the respective pressures P1 and P2. In use, the membrane 59 will be subject to a deformation that is a function exclusively of the pressure P1, whereas the membrane 69 will be subject to a deformation that is a function exclusively of the pressure P2 (neglecting possible deformations caused by residual stresses). The respective signals transduced by the respective piezoresistors are sent to the processing chip 22 for being processed by the ASIC 22', which may thus supply at output both the absolute values of the pressures P1 and P2 measured and the differential value of the pressures P1 and P2.

Figure 4:
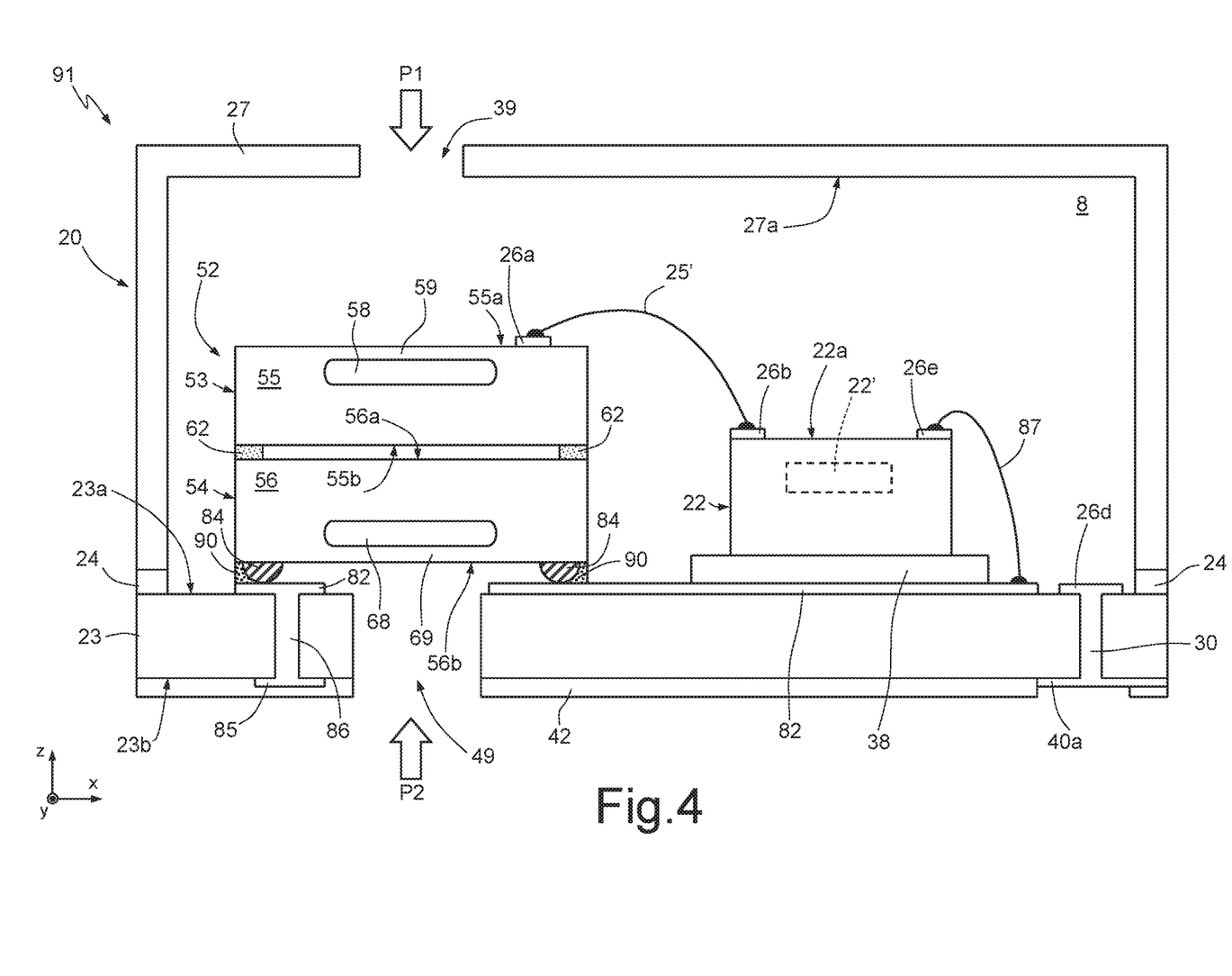
FIG. 4 shows, in lateral-sectional view, a transducer modulus according to a further embodiment of the present disclosure, which may be used for carrying out differential measurements and absolute measurements of environmental quantities.

FIG. 4 shows a transducer modulus 91 according to a variant of the embodiment of FIG. 3, and where the first conductive through via 63 that traverses the semiconductor body 55 and the second conductive through via 64 that traverses the semiconductor body 56 are not present. In this embodiment, on the first surface 55a of the semiconductor body 55, one or more electrical contact pads 26a are present designed to form an electrical-contact region for supplying to the ASIC 22' the signals transduced by the piezoresistors of the membrane 59, but not those transduced by the piezoresistors of the membrane 69.

The signals transduced by the piezoresistors of the membrane 69 are, in this embodiment, conveyed by conductive paths 82 formed on the substrate 23 and extending at least in part underneath the second transducer 54. The conductive paths 82 are electrically coupled to pads 26e of the processing chip 22 by one or more wire bonds 87 and one or more routing paths integrated in the substrate 23. Electrical connections between respective contact pads of the second transducer 54 and the conductive paths 82 are formed by solder bumps 84 in a per se known manner (flip-chip technique). To guarantee an adequate fluidic isolation between the environment at pressure P2 and the environment at pressure P1, a filling region 90 is present, which forms a frame along peripheral portions of the surface 56b of the second transducer 54. The filling region 90 extends outside the solder bumps 84 and is formed, for example, by a non-conductive glue or "underfill".

Further conductive paths 85 extend, optionally, on the back 23b of the substrate 23 and are connected to respective portions of the conductive paths 82 by conductive through vias 86 provided through the substrate 23. As an alternative, or in addition, further conductive paths (not illustrated) may optionally extend within the substrate 23.

The pads 26c, illustrated in FIG. 3, are in any case present in the embodiment of FIG. 4 (but are not illustrated) and are coupled to the pad 26d, and thus to the electrical path 30, for routing of the electrical signals from inside the chamber 8 to the outside of the package 20, as has been described with reference to FIG. 3.

According to further variants of the present disclosure, one or both of the transducers 12', 12" of FIG. 2, and one or both of the first and second transducers 53, 54 may be transducers of a type different from what has been described previously, for example transducers chosen in the group comprising: a UV sensor, an IR sensor, and a generic sensor of light signals (e.g., a photodiode).

It is evident that, in the case of use of a transducer of light radiation (e.g., UV or IR transducer), the through openings 39, 49 are configured so as to enable passage of the light radiation so that it impinges on a sensitive area of the respective transducer. In this case, the through openings 39, 49 do not necessarily have to enable a fluidic access, but may be protected by a layer of material transparent to the light radiation to be detected. Consequently, in general, the through openings are windows that enable passage (possibly, selective passage) of the environmental quantity of interest, according to the specific application and the type of transducer used.

Figure 5:
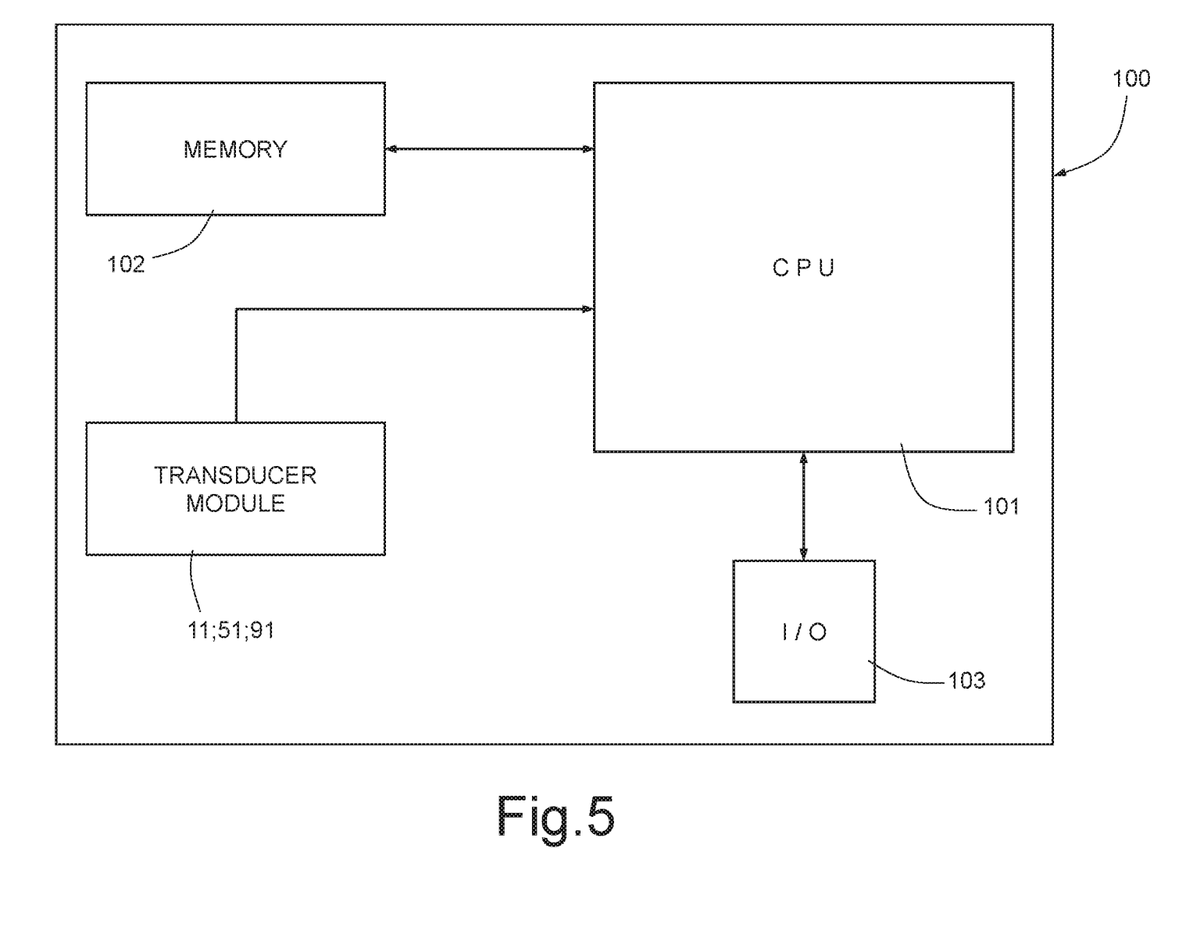
FIG. 5 is a schematic illustration of an electronic apparatus including a transducer modulus according to any one of the embodiments of FIGS. 2-4.

FIG. 5 shows an electronic device 100 that uses the transducer modulus according to any one of the embodiments described previously. The electronic device 100 comprises, in addition to the transducer modulus 11, 51, 91 according to the respective embodiment described, a microprocessor (CPU) 101, a memory block 102, connected to the microprocessor 101, and an input/output interface 103, for example a keypad and/or a display, also this connected to the microprocessor 101. The transducer modulus 11, 51, 91 communicates with the microprocessor 101, and in particular transmits the electrical signals processed by the shared ASIC.

The electronic device 100 is, for example, a mobile communication device, such as a cellphone, a PDA, a notebook, a voice recorder, an audio player with voice-recording function, a console for videogames, or a photographic camera and/or video camera; the electronic device 100 may also be a hydrophone, or else an instrument for measuring environmental quantities, such as, in particular, an industrial absolute-pressure meter and/or relative-pressure meter.

The advantages of the disclosure described previously, according to the various embodiments, emerge clearly from the foregoing description.

In particular, the present disclosure provides a transducer modulus that may be adapted to different configurations according to the need, at the same time reducing the costs and requirements of space.

Finally, it is clear that modifications and variations may be made to what has been described and illustrated herein, without thereby departing from the scope of the present disclosure.

In particular, a different configuration of the MEMS transducers may be envisaged, in particular as regards the geometrical shapes of the constituent elements. In the case where the space inside the package so allows, there may possibly be housed inside a same package also a number of MEMS sensors or transducers, each configured to detect a respective environmental quantity.

Further, it is evident that the through opening 39 in the cap 27 may be formed in any region of the cap 27 (top, lateral, etc.), according to the need.

It should further be noted that formation of the electrical contacts by solder bumps 84, shown in FIG. 4, may be applied, in a similar way, also in the presence of a monolithic transducer modulus, of the type illustrated in FIG. 1.

Further, according to further variant embodiments of FIGS. 3 and 4, the first and second chips, which integrate the first and second MEMS transducers 53 and 54, respectively, may be arranged alongside one another. In this case, there is the disadvantage of a greater area occupation, but the steps of assembly of the first and second chips are simpler in so far as no step of alignment is required in order to stack the first and second chips on one another. As already described with reference to FIGS. 3 and 4, the second MEMS transducer 54 has a sensitive element (e.g., a membrane provided with piezoresistors) facing the second opening 49 and is coupled to the substrate 23 by one or more interface coupling layers that fluidically isolate the second opening 49 from the chamber 8. The first MEMS transducer 53 has a sensitive element (e.g., a respective membrane provided with piezoresistors) facing the chamber 8.

Finally, according to further embodiments, the processing chip 22 may be integrated, at least in part, in the substrate 23 or else may be arranged outside the chamber 8. For example, the processing chip 22 may form part of a PCB on which the package 20 is mounted. In this case, the transduced signal generated by the transducers 12', 12", or by the transducers 53, 54 according to the respective embodiments, is supplied to the external processing chip by the electrical connection elements 40a, which receive the transduced signals by appropriate electrical connections with the transducers 12', 12" (or transducers 53, 54). Said electrical connections include wire bonding, and/or conductive paths formed on the substrate 23 or integrated therein, in a way similar to what has been described with reference to FIGS. 2-4.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transducer modulus, comprising:
   a cap having a first through opening;
   a supporting substrate having a second through opening, the cap coupled to the supporting substrate to define a single chamber; and
   one or more semiconductor chips in the single chamber and coupled to the supporting substrate so that the one or more semiconductor chips covers the second through opening, the one or more semiconductor chips comprising:
      a first MEMS transducer at a first surface and having a first sensitive element facing the first through opening in the cap, the first MEMS transducer configured to detect a first environmental quantity and generate a first transduced signal as a function of the first environmental quantity detected; and
      a second MEMS transducer at a second surface and having a second sensitive element facing the second through opening in the supporting substrate, the second surface being opposite the first surface, the second MEMS transducer configured to detect a second environmental quantity and generate a second transduced signal as a function of the second environmental quantity detected, the second sensitive element being fluidicly isolated from the first sensitive element.

2. The transducer modulus according to claim 1, further comprising an isolating region arranged between the second MEMS transducer and the supporting substrate, the isolating region being configured to fluidically isolate the second sensitive element from the single chamber.

3. The transducer modulus according to claim 1, further comprising a fixing structure configured to secure the second MEMS transducer to the supporting substrate, the fixing structure including at least one of:
   a solder mask surrounding the second sensitive element;
   a layer of glue surrounding the second sensitive element;
   an adhesive layer surrounding the second sensitive element; or
   solder bumps arranged alongside the second sensitive element.

4. The transducer modulus according to claim 1, further comprising a processing chip arranged in the single chamber or integrated in the supporting substrate, the processing chip being functionally coupled to the first and second MEMS transducers and configured to receive, in use, the first and second transduced signals, respectively.

5. The transducer modulus according to claim 4, wherein the processing chip is an ASIC.

6. The transducer modulus according to claim 4, wherein the processing chip is functionally coupled to the first and second MEMS transducers by wire bonds.

7. The transducer modulus according to claim 1, wherein the first MEMS transducer and the second MEMS transducer are one of a pressure transducer, a light-radiation sensor, a UV sensor, and an IR sensor, configured, respectively, to detect an environmental quantity from among an environmental pressure, visible light radiation, UV radiation, and IR radiation.

8. The transducer modulus according to claim 1, wherein the supporting substrate is made of semiconductor material or epoxy resin.

9. An electronic apparatus, comprising:
   a microprocessor; and
   a transducer modulus coupled to the microprocessor, the transducer modulus including:
     a cap having a first through opening;
     a supporting substrate having a second through opening, the cap coupled to the supporting substrate to define a chamber;
     a first chip comprising a first MEMS transducer, the first MEMS transducer having a first sensitive element facing the first through opening in the cap, the first MEMS transducer configured to detect a first environmental quantity and generate a first transduced signal as a function of the first environmental quantity detected;
     a second chip comprising a second MEMS transducer, the second chip vertically stacked with the first chip and located between the first MEMS transducer and the supporting substrate, the second MEMS transducer having a second sensitive element facing the second through opening in the supporting substrate, the second sensitive element being fluidicly isolated from the chamber, the second MEMS transducer configured to detect a second environmental quantity and generate a second transduced signal as a function of the second environmental quantity detected; and
     an ASIC, wherein the second MEMS transducer is coupled to the ASIC by a conductive via through the first chip.

10. The electronic apparatus according to claim 9, wherein the electronic apparatus is at least one of a cellphone, a personal digital assistant, a notebook, a voice recorder, an audio player with voice-recording function, a console for videogames, a hydrophone, a photographic camera and/or a video camera, an instrument for measuring environmental quantities, an industrial absolute-pressure meter, or an industrial relative-pressure meter.

11. A method comprising:
   coupling one or more chips to a supporting substrate such that the one or more chips covers a first through opening in the supporting substrate, the one or more chips including a first MEMS transducer at a first surface and a second MEMS transducer at a second surface that is opposite to the first surface, the first MEMS transducer having a first sensitive element facing away from the supporting substrate, the first MEMS transducer being configured to detect a first environmental quantity and generate a first transduced signal as a function of the first environmental quantity detected, the second MEMS transducer having a second sensitive element facing toward the first through opening in the supporting substrate, the second MEMS transducer being configured to detect a second environmental quantity and generate a second transduced signal as a function of the environmental quantity detected; and
   coupling a cap to the supporting substrate to enclose the one or more chips in a single chamber, the cap including a second through opening that is in fluid communication with the first sensitive element.

12. The method according to claim 11, wherein coupling the one or more chips to the supporting substrate comprises forming an isolating region between the second MEMS transducer and the supporting substrate that is configured to fluidically isolate the second sensitive element from the single chamber.

13. The method according to claim 12, wherein forming the isolating region includes at least one of:
   forming a frame of glue that surrounds the second sensitive element; and
   forming a frame of underfill that surrounds the second sensitive element.

14. The method according to claim 11, wherein coupling the one or more chips to the supporting substrate includes at least one of:
   forming a solder mask on a surface of the supporting substrate and surrounding the second sensitive element;
   forming a layer of glue on at least one of a surface of the one or more chips and a surface of the supporting substrate, the layer of glue surrounding the second sensitive element;
   providing an adhesive layer surrounding the second sensitive element; or
   forming solder bumps alongside the second sensitive element.

15. The method according to claim 11, further comprising:
   coupling a processing chip to the supporting substrate; and
   functionally coupling the processing chip to the first and second MEMS transducers to receive, in use, the first and second transduced signals, respectively.

16. The method according to claim 15, wherein functionally coupling the processing chip to the first and second MEMS transducers comprises coupling first wire bonds between the processing chip and the first MEMS transducer and coupling second wire bonds between the processing chip and the second MEMS transducer.

17. The method according to claim 11, wherein the one or more chips is a single chip comprising a monolithic body of semiconductor material that integrates the first sensitive element on a first side and the second sensitive element on a second side that is opposite to the first side.

18. The transducer modulus according to claim 1, wherein the first through opening of the cap is arranged vertical with respect to the second through opening of the supporting substrate, and wherein at least a portion of the first through opening of the cap faces at least a portion of the second through opening of the supporting substrate.

19. The electronic apparatus according to claim 9, wherein the first through opening of the cap is vertically aligned with the second through opening of the supporting substrate.

20. The electronic apparatus according to claim 9, wherein the first through opening of the cap is arranged vertical with respect to the second through opening of the supporting substrate, and wherein at least a portion of the first through opening of the cap faces at least a portion of the second through opening of the supporting substrate.

\* \* \* \* \*